US005745323A

United States Patent [19]
English et al.

[11] Patent Number: 5,745,323
[45] Date of Patent: Apr. 28, 1998

[54] ELECTROSTATIC DISCHARGE PROTECTION CIRCUIT FOR PROTECTING CMOS TRANSISTORS ON INTEGRATED CIRCUIT PROCESSES

[75] Inventors: Stephen T. English, Groveland; Edward L. Wolfe, North Andover, both of Mass.

[73] Assignee: Analog Devices, Inc., Norwood, Mass.

[21] Appl. No.: 496,933

[22] Filed: Jun. 30, 1995

[51] Int. Cl.$^6$ .................................................. H02H 9/00
[52] U.S. Cl. ................................................ 361/56; 361/111
[58] Field of Search ............................. 361/56, 111, 91; 257/355

[56] References Cited

U.S. PATENT DOCUMENTS

| | | |
|---|---|---|
| 3,819,986 | 6/1974 | Fukuoka . |
| 4,005,342 | 1/1977 | Davis . |
| 4,039,869 | 8/1977 | Goldman et al. . |
| 4,061,928 | 12/1977 | Kessler . |
| 4,066,918 | 1/1978 | Heuner et al. . |
| 4,186,418 | 1/1980 | Seiler . |
| 4,288,829 | 9/1981 | Tango . |
| 4,366,522 | 12/1982 | Baker . |
| 4,385,337 | 5/1983 | Asano et al. . |
| 4,400,711 | 8/1983 | Avery . |
| 4,408,245 | 10/1983 | Pryor . |
| 4,456,940 | 6/1984 | Hammerberg et al. . |
| 4,509,067 | 4/1985 | Minami et al. . |
| 4,567,500 | 1/1986 | Avery . |
| 4,580,063 | 4/1986 | Torelli et al. . |
| 4,581,672 | 4/1986 | Lucero . |
| 4,605,980 | 8/1986 | Hartranft et al. . |
| 4,630,162 | 12/1986 | Bell et al. . |
| 4,631,567 | 12/1986 | Kokado et al. . |
| 4,633,283 | 12/1986 | Avery . |
| 4,644,250 | 2/1987 | Hartgring . |
| 4,678,950 | 7/1987 | Mitake . |
| 4,686,383 | 8/1987 | Croft . |
| 4,692,834 | 9/1987 | Iwahashi et al. . |
| 4,698,720 | 10/1987 | Finaurini . |
| 4,704,654 | 11/1987 | Aberle et al. . |
| 4,739,378 | 4/1988 | Ferrari et al. . |
| 4,742,422 | 5/1988 | Tigges . |
| 4,775,809 | 10/1988 | Watanabe . |
| 4,789,917 | 12/1988 | Miller . |
| 4,811,155 | 3/1989 | Kuriyama et al. . |
| 4,819,047 | 4/1989 | Gilfeather et al. . |
| 4,826,243 | 5/1989 | Lawson . |
| 4,829,350 | 5/1989 | Miller .................................... 357/23.13 |
| 4,835,653 | 5/1989 | Zhang et al. . |
| 4,839,768 | 6/1989 | Daniele et al. ............................ 361/56 |
| 4,855,620 | 8/1989 | Duvvury et al. . |
| 4,858,055 | 8/1989 | Okitaka . |
| 4,868,705 | 9/1989 | Shiochi et al. . |
| 4,870,530 | 9/1989 | Hurst et al. . |

(List continued on next page.)

FOREIGN PATENT DOCUMENTS 2-97222  9/1990  Japan .

OTHER PUBLICATIONS

U.S. application No. 08/123,604, Filed Sep. 17, 1993, Wolfe.
U.S. application No. 08/501,999, Filed Jul. 13, 1995, Olney.
U.S. application No. 08/494,167, Filed Jun. 23, 1995, Minogue.

*Primary Examiner*—Fritz Fleming
*Assistant Examiner*—Sally C. Medley
*Attorney, Agent, or Firm*—Wolf, Greenfield & Sacks, Inc.

[57] ABSTRACT

An apparatus and method for protecting semiconductor switching devices from damage due to electrostatic discharge is provided. The apparatus detects the occurrence of an ESD event, and turns the switching circuit to an operating state in which electrostatic charge is dissipated through the switching circuit. In embodiments of the invention, the switching circuit is a CMOS inverter circuit and the apparatus includes a PMOS transistor that upon occurrence of an ESD event couples an output of the inverter circuit to ground to discharge the electrostatic charge.

6 Claims, 4 Drawing Sheets

U.S. PATENT DOCUMENTS

| | | |
|---|---|---|
| 4,896,243 | 1/1990 | Chatterjee et al. ............ 361/91 |
| 4,920,445 | 4/1990 | Jun . |
| 4,930,036 | 5/1990 | Sitch . |
| 4,939,616 | 7/1990 | Rountree . |
| 4,949,212 | 8/1990 | Lenz et al. . |
| 4,963,766 | 10/1990 | Lundberg . |
| 4,990,802 | 2/1991 | Smooha . |
| 4,994,874 | 2/1991 | Shimizu et al. . |
| 4,996,626 | 2/1991 | Say . |
| 5,027,181 | 6/1991 | Larik et al. . |
| 5,028,819 | 7/1991 | Wei et al. . |
| 5,034,845 | 7/1991 | Murakami . |
| 5,051,860 | 9/1991 | Lee et al. . |
| 5,053,643 | 10/1991 | Tanaka et al. . |
| 5,060,037 | 10/1991 | Rountree . |
| 5,086,365 | 2/1992 | Lien . |
| 5,144,518 | 9/1992 | Miyazaki . |
| 5,144,519 | 9/1992 | Chang . |
| 5,153,802 | 10/1992 | Mertz et al. . |
| 5,157,573 | 10/1992 | Lee et al. . |
| 5,159,518 | 10/1992 | Roy . |
| 5,196,981 | 3/1993 | Kuo . |
| 5,200,876 | 4/1993 | Takeda et al. . |
| 5,208,719 | 5/1993 | Wei ............................ 361/56 |
| 5,212,616 | 5/1993 | Dhong et al. . |
| 5,218,506 | 6/1993 | Harris . |
| 5,237,395 | 8/1993 | Lee . |
| 5,239,440 | 8/1993 | Merrill . |
| 5,255,146 | 10/1993 | Miller ........................ 361/56 |
| 5,268,588 | 12/1993 | Marum . |
| 5,272,586 | 12/1993 | Yen . |
| 5,276,582 | 1/1994 | Merrill et al. . |
| 5,287,241 | 2/1994 | Puar . |
| 5,289,334 | 2/1994 | Ker et al. . |
| 5,291,051 | 3/1994 | Hoang et al. . |
| 5,291,365 | 3/1994 | Takagi . |
| 5,301,084 | 4/1994 | Miller . |
| 5,311,391 | 5/1994 | Dungan et al. . |
| 5,319,259 | 6/1994 | Merrill . |
| 5,333,093 | 7/1994 | Krautschneider et al. . |
| 5,335,134 | 8/1994 | Stein et al. . |
| 5,343,352 | 8/1994 | Nagamine . |
| 5,345,356 | 9/1994 | Pianka . |
| 5,359,211 | 10/1994 | Croft . |
| 5,392,185 | 2/1995 | Haas, Jr. et al. . |
| 5,400,202 | 3/1995 | Metz et al. . |
| 5,406,105 | 4/1995 | Lee . |
| 5,412,527 | 5/1995 | Husher . |
| 5,424,892 | 6/1995 | Topp et al. . |
| 5,426,323 | 6/1995 | Reczek et al. . |
| 5,430,595 | 7/1995 | Wagner et al. . |
| 5,440,162 | 8/1995 | Worley et al. . |
| 5,450,267 | 9/1995 | Diaz et al. . |
| 5,452,171 | 9/1995 | Metz et al. . |
| 5,453,900 | 9/1995 | Feldtkeller . |
| 5,455,732 | 10/1995 | Davis . |
| 5,463,520 | 10/1995 | Nelson . |
| 5,465,189 | 11/1995 | Polgreen et al. . |
| 5,473,500 | 12/1995 | Payne et al. . |
| 5,477,413 | 12/1995 | Watt . |
| 5,477,414 | 12/1995 | Li et al. . |
| 5,479,039 | 12/1995 | Lien . |
| 5,495,118 | 2/1996 | Kinoshita et al. . |

ELECTROSTATIC DISCHARGE PROTECTION CIRCUIT FOR PROTECTING CMOS TRANSISTORS ON INTEGRATED CIRCUIT PROCESSES

BACKGROUND OF THE INVENTION

1. Field of the Invention

The present invention relates generally to integrated circuits, and more particularly, to a method and apparatus for protecting integrated circuits from electrostatic discharge.

2. Discussion of the Related Art

Electrostatic discharge or ESD is a well-known cause of failure for integrated circuits. The build up of electrostatic charge on personnel and equipment during the manufacture and use of integrated circuits may assume potentials as high as 30,000 volts with respect to an ESD reference point. The built-up charge may be discharged through an integrated circuit when either the personnel or the equipment comes in contact with the integrated circuit. The electrostatic discharge may occur during manufacturing or testing when the integrated circuit is non-operating, or it may occur when the integrated circuit is installed in a device and is operating. Integrated circuits are particularly susceptible to ESD damage during handling in a manufacturing or testing environment.

An electrostatic discharge through an integrated circuit can permanently damage the integrated circuit through several failure mechanisms including the dielectric breakdown of oxides and other thin films, and the melting of conductive material such as polysilicon or aluminum, resulting in open or short circuits in the integrated circuit.

Several test procedures exist for testing integrated circuits to determine exposure threshold levels to electrostatic discharge. These test procedures include MIL-STD-883D, method 3015.7, published by the United States Department of Defense. This method is based on a "human body model" and uses an ESD generator designed to simulate an electrostatic discharge from a human body. The ESD generator circuit includes a 100 pF capacitor in series with a 1,500 ohm resistor. ESD voltage threshold levels may be established for devices using this method. Devices which exhibit low thresholds to damage from an electrostatic discharge may be subject to special handling procedures and may also incorporate ESD protection devices.

The special handling procedures may include the use of anti-static materials on manufacturing floors, bench tops, and other surfaces used during the manufacture and testing of integrated circuits. Additionally, operators handling sensitive integrated circuits may be required to wear wrist or ankle straps that are connected to ground, to prevent electrostatic charge build up on their bodies.

Integrated circuits containing metal oxide semiconductor (MOS) transistors are particularly sensitive to electrostatic discharge at their input and output pins. Several approaches to ESD protection circuits have been developed to protect MOS transistors from ESD at their input and output pins. These circuits often consist of large parallel protection circuits, external to the device to be protected, and comprising diodes, thick oxide MOS devices, and SCRs. These large parallel protection circuits often include a series resistor. U.S. Pat. No. 4,829,350, "Electrostatic Discharge Integrated Circuit Protection", issued to Bernard D. Miller, discloses an ESD protection circuit for the input pins of CMOS integrated circuits that includes a series resistor and parallel clamping diodes. This patent also discloses the use of clamping diodes in parallel with the output to provide ESD protection for the output pins. U.S. Pat. No. 4,896,243, "Efficient ESD Input Protection Scheme", issued to Amitava Chaterjee, et al., similarly discloses an ESD protection circuit for the input of an integrated circuit using a series resistor and a parallel clamping diode.

There are several known disadvantages to using the ESD protection circuits of the prior art. Parallel clamping diodes require a relatively large area and exhibit undesirable parasitic capacitance. Further, these large diode clamps require a low impedance return path as described in U.S. Pat. No. 4,839,768, "Protection of Integrated Circuits From Electrostatic Discharges", issued to Viscenzo Daniele, et al. Without a low impedance return path, the effectiveness of these large diode clamps is greatly reduced. Additionally, large clamping devices may not be standard devices that can be integrated into integrated circuits without special processing steps. Furthermore, non-standard devices used to provide ESD protection in some cases are not manufactured to the same quality standards as the integrated circuits to be protected and as a result may have greater voltage breakdown tolerances, leading to less predictable ESD protection behavior. The use of series resistors is also undesirable, particularly on output pins, since series resistance reduces the drive capability of output drivers.

A protection circuit is provided in U.S. Pat. No. 4,855,620 for the output pins of a CMOS transistor buffer circuit. As disclosed in U.S. Pat. No. 4,855,620, "Output Buffer With Improved ESD Protection", issued to Charvaka Duvvury, et al., an ESD event at the output pin of a CMOS transistor buffer circuit may result in a secondary breakdown current in the output CMOS transistor from the drain to the source. This breakdown current causes localized heating, determined by the product of the local current density and the electric field, which may cause damage to the CMOS transistor. The protection circuit disclosed in U.S. Pat. No. 4,855,620 is designed to hold the potential of the gate electrode of the output CMOS transistor to a ground potential to minimize the effect of the secondary breakdown current. In the disclosed circuit, the MOS device still exhibits a secondary breakdown, and therefore, some localized heating.

SUMMARY OF THE INVENTION

As has been discussed above, MOS transistors used in integrated circuits may exhibit a secondary breakdown causing damage to the device when an electrostatic discharge occurs between the drain and source of the transistor. In embodiments of the present invention, an output transistor of an integrated circuit is turned on to become the primary discharge path when an ESD event is detected, to limit the damage to the device from a secondary breakdown.

According to one aspect of the present invention, an apparatus is provided for protecting a switching circuit from an electrostatic discharge. The switching circuit has an output, a control input, and first and second signal inputs, and is responsive to a control signal at the control input for activating an "on" state of the switching circuit in which the output is coupled to the second signal input. The apparatus provides ESD protection for an electrostatic discharge applied between the output and the second signal input of the switching circuit. The apparatus comprises a protection device having a control input coupled to the switching circuit to detect an electrostatic discharge, and an output, coupled to the control input of the switching circuit, that provides the control signal to the switching circuit to turn the switching circuit to the on state when the electrostatic discharge is detected.

According to another aspect of the present invention, an integrated circuit having ESD protection is provided. The integrated circuit has first and second signal inputs, a control input, and an output. ESD protection is provided for protecting the integrated circuit from an electrostatic discharge applied between the output of the integrated circuit and the second signal input of the integrated circuit. The integrated circuit comprises a switching circuit having an "on" state in which the output of the integrated circuit is coupled to the second signal input of the integrated circuit. The switching circuit is responsive to a control signal at the control input for activating the "on" state of the switching circuit. The integrated circuit further comprises a protection circuit having a first signal input, a control input coupled to the switching circuit to detect an electrostatic discharge, and an output, coupled to the control input of the integrated circuit, that provides the control signal to the switching circuit to turn the switching circuit to the "on" state when an electrostatic discharge is detected.

In a preferred embodiment of the present invention, the switching circuit may be a PMOS/NMOS inverter, and the protection circuit may include a PMOS transistor.

According to another aspect of the present invention a method is provided for protecting a switching circuit from an electrostatic discharge. The switching circuit has an output, a control input, and first and second signal inputs, and is responsive to a control signal at the control input for activating an 'on" state of the switching circuit in which the output is coupled to the second signal input. The method provides protection against an electrostatic discharge applied between the output and the second signal input of the switching circuit. The method comprises steps of detecting when an electrostatic discharge occurs, and in response, providing the control signal to activate the "on" state of the switching circuit.

DESCRIPTION OF THE FIGURES

For a better understanding of the present invention, reference is made to the accompanying drawings, which are incorporated herein by reference and in which.

DETAILED DESCRIPTION

Figure 1:
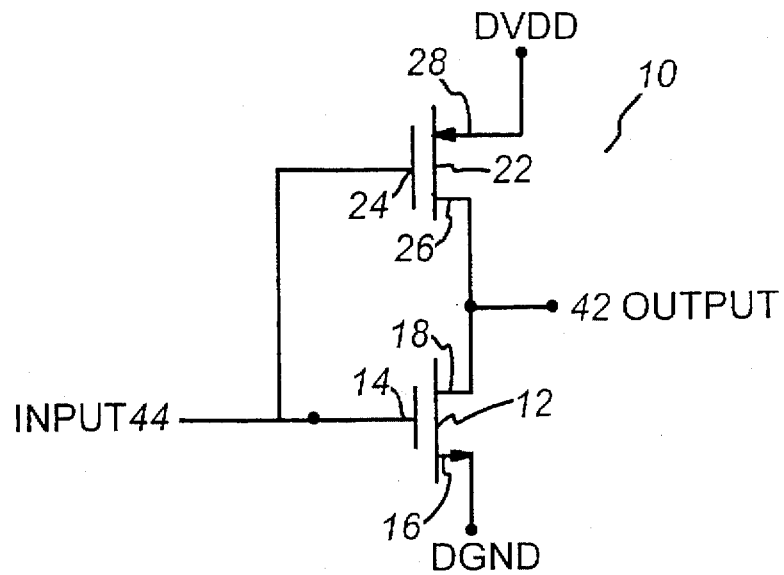
FIG. 1 is a schematic diagram of an inverter circuit of the prior art.

FIG. 1 shows a schematic of an inverter circuit 10 that is well-known in the art. The inverter circuit 10 includes transistors 12 and 22. Transistor 12 is an NMOS transistor having a source 16 connected to a ground terminal DGND, a gate 14 connected to an input terminal 44 and a drain 18 connected to an output terminal 42. Transistor 22 is a PMOS transistor having a drain 26 connected to the output terminal 42, a gate 24 connected to the input terminal 44, and a source 28 connected to a power supply terminal DVDD. The operation of the inverter circuit 10 shown in FIG. 1 is well known in the art. In the inverter circuit of FIG. 1, transistor 12 may be subject to damage from an electrostatic discharge at the output terminal 42 having a positive polarity with respect to the ground terminal DGND.

Figure 2:
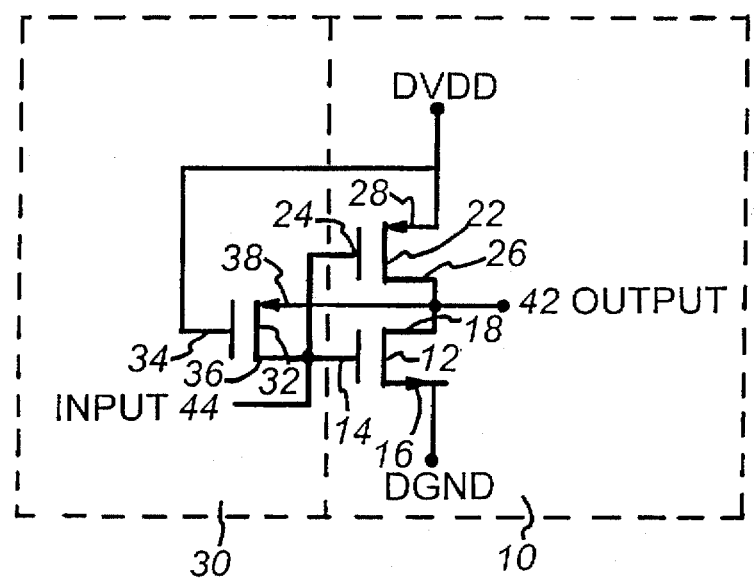
FIG. 2 is a schematic diagram of a first embodiment of the present invention.

One embodiment of a protection circuit for protecting the inverter shown in FIG. 1 from an electrostatic discharge at the output terminal 42 will be described with reference to FIG. 2. In FIG. 2, an ESD protection circuit 30 is shown connected to the inverter circuit 10 of FIG. 1. The ESD protection circuit 30 includes a PMOS protection transistor 32 having a source 38 connected to the output terminal 42 of the inverter circuit 10, a gate 34 connected to the power supply terminal DVDD, and a drain 36 connected to gate 14 of transistor 12 and gate 24 of transistor 22.

When an electrostatic discharge occurs at the output terminal, having a positive polarity with respect to the ground terminal DGND, protection transistor 32 is turned on as the voltage between the source 38 and the gate 34 exceeds the source-gate threshold voltage of the protection transistor 32. When the protection transistor 32 turns on, the gate 14 of transistor 12 is shorted to the drain 18 of transistor 12, actively biasing transistor 12 to be on. Once transistor 12 is turned on, it becomes the primary discharge path of the electrostatic charge.

Transistor 12 remains on for the duration of the ESD event until the drain to source breakdown voltage is exceeded. Some or all of the electrostatic charge discharged through transistor 12 will be dissipated at a lower drain to source voltage, $V_{DS}$, than in the prior art systems for which the transistor remains off during the ESD event. This lower $V_{DS}$ results in a lower power density in the transistor 12. Further, since the transistor 12 will be entirely turned on by design, the current through the device will be uniform, preventing local current hot spots. If a secondary breakdown of the device does subsequently occur, the uniformity of the current through the device should make the breakdown of the drain uniform across the device as well, reducing the risk of damage to the transistor 12.

Electrostatic discharge test results of the embodiment of the invention shown in FIG. 2 show greater than a three fold improvement in the human body model ESD threshold level over similar test results of the inverter circuit of FIG. 1.

Figure 3:
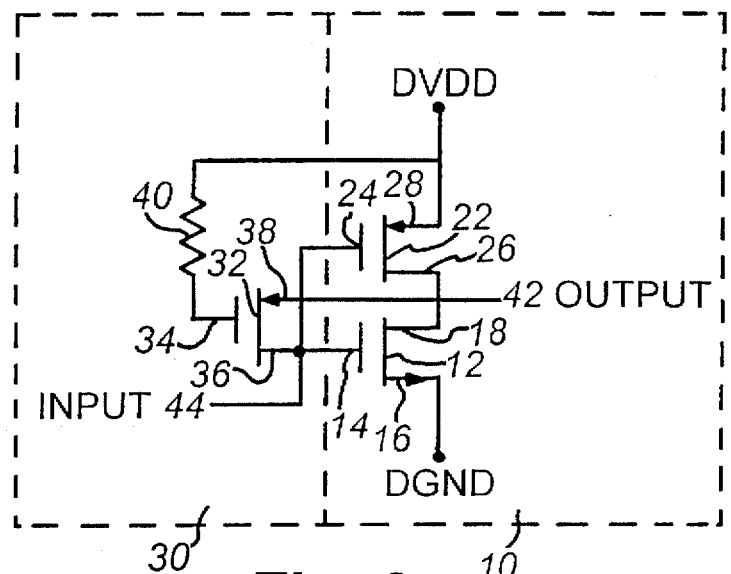
FIG. 3 is a schematic diagram of a second embodiment of the present invention.

A second embodiment of the present invention will now be described with reference to FIG. 3. FIG. 3 shows the embodiment of FIG. 2 with a resistor 40 connected between the gate 34 of transistor 32 and the power supply terminal DVDD. The embodiment shown in FIG. 3 operates in the same manner as described above for the embodiment of FIG. 2. The resistor 40 reduces the voltage at gate 34 of transistor 32 with respect to a voltage at the power supply terminal DVDD to provide additional voltage isolation for transistor 32.

Figure 4:
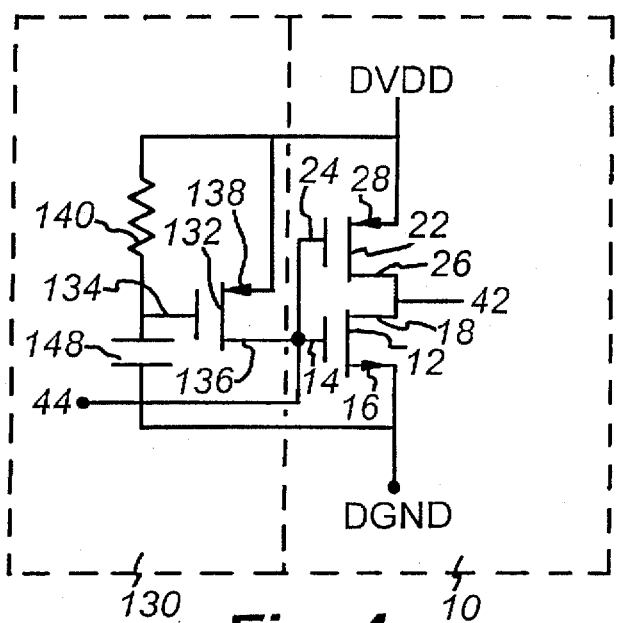
FIG. 4 is a schematic diagram of a third embodiment of the present invention.

A third embodiment of the present invention will now be described with reference to FIG. 4. FIG. 4 shows the inverter circuit 10 of FIG. 1 connected to an ESD protection circuit 130. The ESD protection circuit 130 includes a PMOS protection transistor 132 having a source 138 connected to the power supply terminal DVDD, a drain 136 connected to the gate 14 of the NMOS transistor 12 and the gate 24 of the PMOS transistor 22, and a gate 134. The ESD protection circuit 130 also includes a resistor 140 connected between the gate 134 of the protection transistor 132 and the power supply terminal DVDD, and a capacitor 148 connected between the gate 134 of the protection transistor 132 and the ground terminal DGND.

When an electrostatic discharge occurs at the output terminal, having a positive polarity with respect to the ground terminal DGND, an inherent parasitic diode in PMOS transistor 22 dissipates charge to the power supply terminal DVDD causing a voltage at the power supply terminal DVDD to increase. The increase in voltage at the power supply terminal DVDD causes the protection transistor 132 to be turned on. When the protection transistor 132 turns on, the necessary gate drive is provided for the NMOS transistor 12, turning the NMOS transistor 12 on and discharging the electrostatic charge through the NMOS transistor 12 as described in the previous embodiments. Values are chosen for the resistor 140 and the capacitor 148 such that the protection transistor 132 will be on for approximately 150 nanoseconds, which is greater than a typical duration of an ESD pulse.

During normal operation of the inverter circuit 10 (i.e., with supply voltages applied), the protection transistor 132 will similarly be on for approximately 150 nanoseconds after initially providing power to the circuit. After 150 nanoseconds, the capacitor 148 is charged to the voltage of a power supply, coupled to the power supply terminal DVDD, and the protection transistor 132 is then shut off and remains off for normal operation of the inverter circuit 10.

Figure 5:
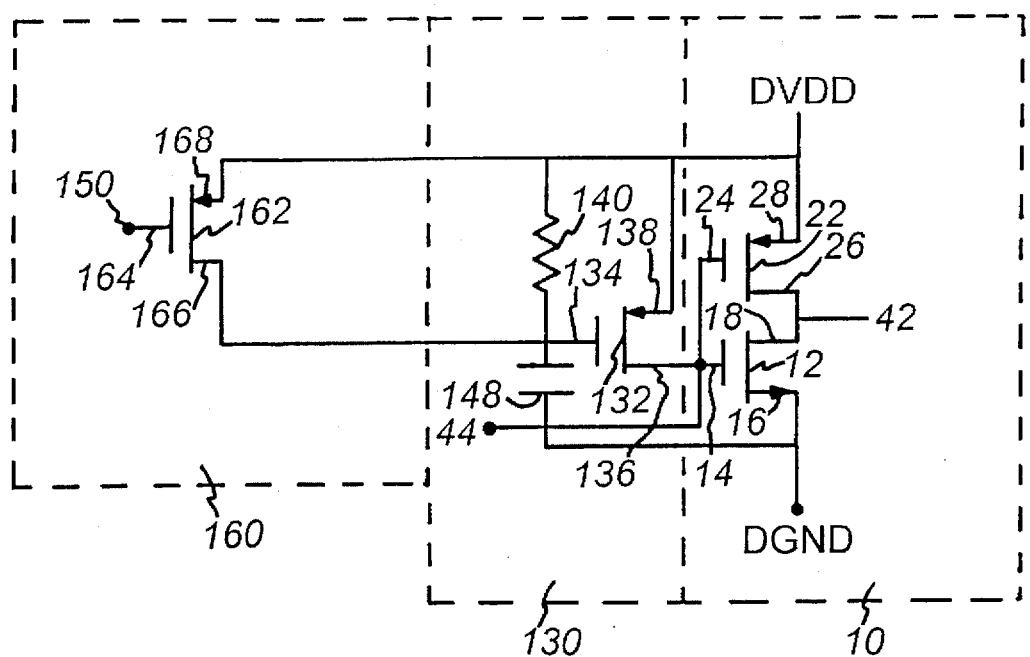
FIG. 5 is a schematic diagram of a fourth embodiment of the present invention.

A fourth embodiment of the present invention will now be described with reference to FIG. 5. FIG. 5 shows the inverter circuit 10 and the ESD protection circuit 130 described above with respect to FIG. 4. An additional reset circuit 160 is also shown in FIG. 5. The reset circuit 160 includes a reset transistor 162 having a gate 164 connected to a reset input 150, a drain 166 connected to the gate 134 of the protection transistor 132, and a source 168 connected to the power supply terminal DVDD.

The embodiment of the present invention shown in FIG. 5 operates in the same manner as does the embodiment shown in FIG. 4 when an electrostatic discharge having a positive polarity occurs at the output 42 with respect to the ground terminal DGND. The reset circuit 160 is used to reduce the time required to charge capacitor 148 to the voltage at the power supply terminal DVDD upon initial power turn on of the inverter circuit 10. Upon initial power turn on, a reset signal is provided to reset input 150 to turn the reset transistor 162 on, short circuiting the resistor 140. With the resistor 140 short circuited, the capacitor 148 charges quickly, thus reducing the impact of the ESD protection circuit 130 on the operation of the inverter circuit 10.

Figure 6:
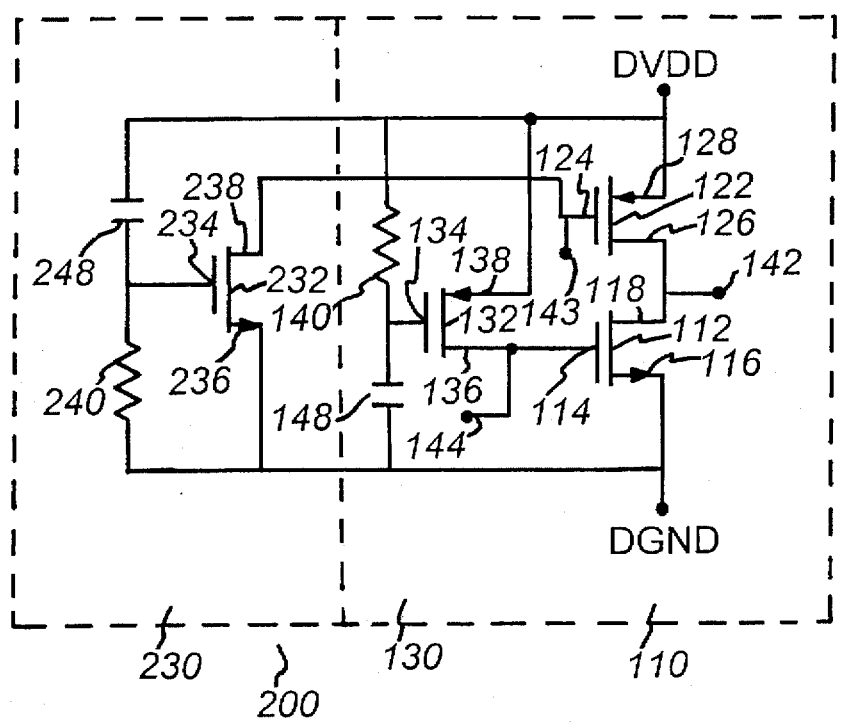
FIG. 6 is a schematic diagram of a fifth embodiment of the present invention.

A fifth embodiment of the present invention will now be described with reference to FIG. 6. FIG. 6 shows a tri-state inverter circuit 110 connected to an ESD protection circuit 200. The tri-state inverter circuit 110 is similar to the inverter circuit 10 previously described; and the corresponding components of the tri-state inverter circuit 110 and the inverter circuit 10 have the same reference numerals except that a prefix of "1" is added to the components of the tri-state inverter circuit. The tri-state inverter circuit 110 differs from the inverter circuit 10 in that the gate 124 of the PMOS transistor 122 is not connected to the gate 114 of NMOS transistor 112, but is connected to a second input terminal 143 of the tri-state inverter circuit 110.

The ESD protection circuit 200 comprises the ESD protection circuit 130 of the embodiment of the present invention shown in FIG. 4 and a complementary protection circuit 230 used to turn on the PMOS transistor 122 of the tri-state inverter circuit 110 when an ESD pulse is detected. In the embodiment shown in FIG. 6, the complementary protection circuit 230 includes an NMOS transistor 232 having a source 236 connected to the power supply terminal DGND, a drain 238 connected to the gate 124 of the PMOS transistor 122, and a gate 234. The complementary protection circuit 230 also includes a resistor 240 and a capacitor 248. The resistor 240 is connected between the gate 234 of the NMOS transistor 232 and the ground terminal DGND. The capacitor 248 is connected between the gate 234 of the NMOS transistor 232 and the power supply terminal DVDD.

When an electrostatic discharge occurs at the output 142 having a positive polarity with respect to the ground terminal DGND, the protection circuit 130 operates in the manner previously described, to turn on the NMOS transistor 112. The complementary protection circuit 230 operates in a similar manner to turn on the PMOS transistor 122 when an ESD event occurs at the output 142.

In many integrated circuits, multiple NMOS/PMOS stages similar to the tri-state inverter circuit 110 are connected between the power supply terminal DVDD and the ground terminal DGND. By incorporating the embodiment of the invention shown in FIG. 6 in all of the output NMOS/PMOS stages, a low impedance path between the power supply terminal DVDD and the ground terminal DGND is provided when an ESD event occurs; and both the NMOS and PMOS transistors are turned on resulting in multiple discharge paths for the electrostatic charge to ground (DGND), and thereby minimizing damage to any one device.

It should be understood that the reset circuit 160 of FIG. 5 may be incorporated into the fifth embodiment of the present invention shown in FIG. 6 to minimize the operational impact of the protection circuits 130 and 230 on the inverter circuit 110.

Figure 7:
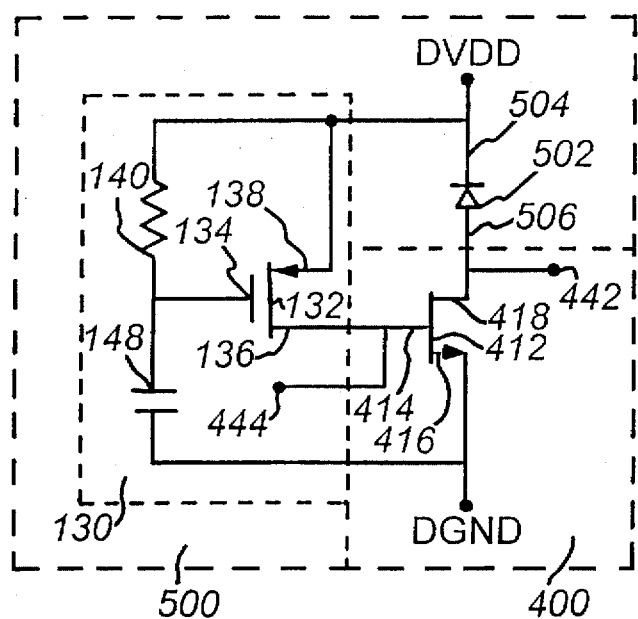
FIG. 7 is a schematic diagram of a sixth embodiment of the present invention.

The sixth embodiment of the present invention will now be described with reference to FIG. 7. In the embodiment shown in FIG. 7, the inverter circuit 10 is replaced with an NMOS transistor 412 providing an open drain output 442. The NMOS transistor 412 has a drain 418 connected to the output 442, a gate 414 connected to an input 444, and a source 416 connected to the ground terminal DGND. An ESD protection circuit 500 is shown connected to the transistor circuit 400. The ESD protection circuit 500 includes the protection circuit 130 of FIG. 4 and a diode 502. The diode 502 has an anode 506 connected to the drain 418 of transistor 412, and a cathode 504 connected to the power supply terminal DVDD. This embodiment of the present invention operates in the same manner as the embodiment shown in FIG. 4. The diode 502 is used to provide the function of the parasitic diode of the PMOS transistor 22 of FIG. 4. In this embodiment of the invention, the protection circuit 130 has been shown as the embodiment of the invention in FIG. 4. It should be understood that in this embodiment of the invention any of the protection circuits from the embodiments of FIGS. 2–5 could be used as the protection circuit 130.

Embodiments of the present invention have been described with reference to an NMOS transistor being used in an inverter stage. It should be understood that the present invention is applicable to other semiconductor devices used in other applications. The scheme described above may be used to protect other semiconductor devices from damage due to electrostatic discharge by sensing the electrostatic discharge across the semiconductor device and in response turning the semiconductor device to an operational state to allow discharge of the electrostatic charge. It should also be understood that the protection schemes shown may be integrated with the device to be protected so that the device is self-protecting, or the protection schemes may be external to the device to be protected.

Having thus described at least one illustrative embodiment of the invention, various alterations, modification and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. An integrated circuit having ESD protection, the integrated circuit comprising:

first and second signal inputs;

a control input;

an output;

a switching circuit, having an on state in which the output of the integrated circuit is coupled to the second signal input of the integrated circuit, the switching circuit responsive to a control signal at the control input for activating the on state of the switching circuit, wherein the switching circuit is a tri-state inverter circuit, having a second control input, including:

a PMOS transistor having a gate coupled to the second control input of the switching circuit, a drain coupled to the output of the integrated circuit, and a source coupled to the first signal input of the integrated circuit; and an NMOS transistor having a drain coupled to the output of the integrated circuit, a gate coupled to the control input of the integrated circuit and a source coupled to the second signal input of the integrated circuit;

a protection circuit having a first input, a control input coupled to the switching circuit to detect an electrostatic discharge, and an output coupled to the control input of the integrated circuit that provides the control signal to the switching circuit to turn the switching circuit to the on state when an electrostatic discharge is detected, wherein the protection circuit includes a PMOS transistor having a gate, drain, and source coupled respectively to the control input, the output, and the first input of the protection circuit;

a resistor connected to the control input of the protection circuit and the first signal input of the integrated circuit, wherein the first input of the protection circuit is coupled to the first signal input of the integrated circuit, such that the resistor is disposed between the first input and the control input of the protection circuit, and wherein the protection circuit provides the control signal upon detection of a voltage across the resistor;

a capacitor, having a first terminal coupled to the control input of the protection circuit and having a second terminal coupled to the second signal input of the integrated circuit;

a reset circuit having a first input coupled to the first signal input of the integrated circuit, a second input coupled to the control input of the protection circuit, and a reset input for receiving a reset signal, the reset circuit being responsive to the reset signal for coupling the first signal input of the integrated circuit to the control input of the protection circuit, wherein the reset circuit includes a PMOS transistor having a gate, source, and drain coupled respectively to the reset input, the first input, and the second input of the reset circuit;

a complementary capacitor having a first terminal, and a second terminal coupled to the source of the PMOS transistor of the tri-state inverter circuit;

a complementary resistor coupled between the first terminal of the complementary capacitor and the source of the NMOS transistor of the tri-state inverter circuit; and a complementary protection circuit having a control input coupled to the first terminal of the capacitor, an output coupled to the gate of the PMOS transistor of the tri-state inverter circuit and an input coupled to the source of the NMOS transistor of the tri-state inverter circuit.

2. The integrated circuit of claim 1, wherein the complementary protection circuit includes an NMOS transistor having a gate, source, and drain coupled respectively to the control input, the input, and the output of the complementary protection circuit.

3. A method for protecting a switching circuit from electrostatic discharge, the switching circuit having an output, first and second control inputs, and first and second signal inputs, the switching circuit responsive to a first control signal at the control input for activating a first state of the switching circuit in which the output is coupled to the second signal input, the switching circuit responsive to a second control signal at the second control input for activating a second state of the switching circuit in which the output is coupled to the first signal input, the electrostatic discharge being applied between the output and the second signal input of the transistor circuit, the method comprising steps of:

detecting when an electrostatic discharge occurs; and when an electrostatic discharge occurs, providing the first control signal to the first control input of the switching circuit to activate the first state of the switching circuit and providing the second control signal to the second control input of the switching circuit to activate the second state of the switching circuit, such that the first input of the switching circuit is coupled to the second input of the switching circuit.

4. The method of claim 3, wherein the switching circuit comprises an NMOS transistor having a gate, drain, and source respectively corresponding to the first control input, the output, and the second input of the switching circuit, and wherein the step of detecting an electrostatic discharge includes detecting an electrostatic discharge applied across the drain and the source of the NMOS transistor.

5. The method of claim 4, further comprising the step of discharging electrostatic charge through the NMOS transistor.

6. The method of claim 4, wherein the step of detecting includes a step of sensing a voltage potential across the output and the first signal input of the switching circuit.

* * * * *